(12) United States Patent
Durbin et al.

(10) Patent No.: US 9,612,259 B2
(45) Date of Patent: Apr. 4, 2017

(54) WAFER TESTING SYSTEM AND ASSOCIATED METHODS OF USE AND MANUFACTURE

(71) Applicant: Translarity, Inc., Fremont, CA (US)

(72) Inventors: Aaron Durbin, Portland, OR (US); David Keith, Vancouver, WA (US); Morgan Johnson, Beaverton, OR (US)

(73) Assignee: Translarity, Inc., Fremont, CA (US)

( * ) Notice: Subject to any disclaimer, the term of this patent is extended or adjusted under 35 U.S.C. 154(b) by 70 days.

(21) Appl. No.: 14/498,905

(22) Filed: Sep. 26, 2014

(65) Prior Publication Data

US 2015/0015292 A1 Jan. 15, 2015

Related U.S. Application Data

(60) Division of application No. 13/849,887, filed on Mar. 25, 2013, now Pat. No. 8,872,533, which is a continuation of application No. 13/247,981, filed on Sep. 28, 2011, now Pat. No. 8,405,414.

(60) Provisional application No. 61/404,234, filed on Sep. 28, 2010.

(51) Int. Cl.
*G01R 1/04* (2006.01)
*G01R 31/26* (2014.01)
*G01R 1/073* (2006.01)
*G01R 31/28* (2006.01)

(52) U.S. Cl.
CPC ............. *G01R 1/04* (2013.01); *G01R 1/0408* (2013.01); *G01R 1/07378* (2013.01); *G01R 31/2601* (2013.01); *G01R 31/2607* (2013.01); *G01R 31/2889* (2013.01); *G01R 1/0491* (2013.01); *G01R 31/2886* (2013.01)

(58) Field of Classification Search
CPC .............................. G01R 1/04; G01R 31/2601
See application file for complete search history.

(56) References Cited

U.S. PATENT DOCUMENTS

| | | | |
|---|---|---|---|
| 4,912,399 A | 3/1990 | Greub et al. |
| 4,975,638 A | 12/1990 | Evans et al. |
| 5,453,701 A | 9/1995 | Jensen et al. |
| 5,477,160 A | 12/1995 | Love |
| 5,986,753 A | 11/1999 | Seelig et al. |

(Continued)

*Primary Examiner* — Jermele M Hollington
(74) *Attorney, Agent, or Firm* — Christensen O'Connor Johnson Kindness PLLC

(57) ABSTRACT

A wafer testing system and associated methods of use and manufacture are disclosed herein. In one embodiment, the wafer testing system includes an assembly for releaseably attaching a wafer to a wafer translator and the wafer translator to an interposer by means of separately operable vacuums, or pressure differentials. The assembly includes a wafer translator support ring coupled to the wafer translator, wherein a first flexible material extends from the wafer translator support ring so as to enclose the space between the wafer translator and the interposer so that the space may be evacuated by a first vacuum through one or more first evacuation paths. The assembly can further include a wafer support ring coupled to the wafer and the chuck, wherein a second flexible material extends from wafer support ring so as to enclose the space between the wafer and the wafer translator so that the space may be evacuated by a second vacuum through one or more second evacuation pathways.

9 Claims, 8 Drawing Sheets

(56) References Cited

U.S. PATENT DOCUMENTS

| | | |
|---|---|---|
| 6,060,892 A | 5/2000 | Yamagata |
| 6,168,974 B1 | 1/2001 | Chang et al. |
| 6,215,320 B1 | 4/2001 | Parrish |
| 6,433,563 B1 | 8/2002 | Maruyama |
| 6,445,200 B2 | 9/2002 | Haseyama |
| 6,737,879 B2 | 5/2004 | Johnson |
| 6,836,130 B2 | 12/2004 | Johnson |
| 6,842,030 B2 | 1/2005 | Kim et al. |
| 6,925,244 B1 | 8/2005 | Kang et al. |
| 6,991,969 B2 | 1/2006 | Johnson |
| 7,049,837 B2 | 5/2006 | Kasukabe et al. |
| 7,055,535 B2 | 6/2006 | Kunisawa et al. |
| 7,221,146 B2 | 5/2007 | Dunklee et al. |
| 7,227,370 B2 | 6/2007 | Kasukabe |
| 7,282,931 B2 | 10/2007 | Johnson |
| 7,456,643 B2 | 11/2008 | Johnson |
| 7,459,924 B2 | 12/2008 | Johnson |
| 7,463,049 B2 | 12/2008 | Arai et al. |
| 7,489,148 B2 | 2/2009 | Johnson |
| 7,498,800 B1 | 3/2009 | Whiteman |
| 7,532,021 B2 | 5/2009 | Johnson |
| 7,532,022 B2 | 5/2009 | Johnson |
| 7,723,980 B2 * | 5/2010 | Johnson ............ G01R 31/2884 324/762.05 |
| 7,724,006 B2 * | 5/2010 | Kasukabe .......... G01R 1/06727 324/754.07 |
| 7,724,008 B2 | 5/2010 | Johnson |
| 7,733,106 B2 | 6/2010 | Dozier, II et al. |
| 7,786,745 B2 | 8/2010 | Johnson |
| 7,791,174 B2 | 9/2010 | Johnson |
| 8,030,957 B2 | 10/2011 | Lindsey et al. |
| 8,076,216 B2 | 12/2011 | Johnson |
| 8,622,752 B2 * | 1/2014 | Parrish ............... G01R 1/07378 439/66 |
| 8,872,533 B2 * | 10/2014 | Durbin ............... G01R 1/07378 324/754.03 |
| 9,052,355 B2 * | 6/2015 | Johnson ............. G01R 31/2887 |
| 2003/0237061 A1 * | 12/2003 | Miller ................ G01R 31/2886 438/18 |
| 2007/0279074 A1 | 12/2007 | Kasukabe et al. |
| 2007/0296449 A1 | 12/2007 | Johnson |
| 2008/0029879 A1 | 2/2008 | Tuckerman et al. |
| 2008/0074135 A1 | 3/2008 | Johnson |
| 2008/0143365 A1 | 6/2008 | Kiesewetter et al. |
| 2009/0212798 A1 | 8/2009 | Kasukabe et al. |
| 2009/0250249 A1 * | 10/2009 | Racz ................... B81C 1/00333 174/252 |
| 2009/0289645 A1 | 11/2009 | Johnson |
| 2010/0065963 A1 | 3/2010 | Eldridge et al. |
| 2010/0144069 A1 * | 6/2010 | Johnson ............. G01R 31/2889 438/17 |
| 2011/0043237 A1 * | 2/2011 | Kiyokawa .......... G01R 31/2893 324/756.03 |
| 2011/0050274 A1 | 3/2011 | Durbin et al. |
| 2012/0086135 A1 * | 4/2012 | Thompson ............. H01L 23/13 257/787 |
| 2012/0112778 A1 | 5/2012 | Johnson |
| 2015/0235871 A1 * | 8/2015 | Akiba .................. H01L 21/563 438/113 |
| 2016/0033569 A1 * | 2/2016 | Johnson ............. G01R 31/2887 324/750.25 |

* cited by examiner

WAFER TESTING SYSTEM AND ASSOCIATED METHODS OF USE AND MANUFACTURE

CROSS REFERENCE TO RELATED APPLICATION

This application is a divisional of U.S. patent application Ser. No. 13/849,887, filed Mar. 25, 2013, now U.S. Pat. No. 8,872,533, which is a continuation of Ser. No. 13/247,981, filed Sep. 28, 2011, now U.S. Pat. No. 8,405,414, which Claims priority to U.S. Provisional Application No. 61/404,234, filed on Sep. 28, 2010, and entitled "ARRANGEMENT OR STACK OF A WAFER CHUCK, WAFER, WAFER TRANSLATOR, AND TESTER DIB BOARD WITH THREE INDEPENDENT VACUUM COMPARTMENTS TO APPLY AND MANAGE CONTACT PRESSURE WITHIN THE STACK; ADDITIONALLY A SYSTEM TO CREATE STANDARDIZED CONTACT PATTERNS ACROSS THE TESTER SIDE OF THE WAFER TRANSLATOR TO MINIMIZE LEAD TIME AND COST TO CREATE CUSTOM TRANSLATORS FOR SPECIFIC WAFER," which are incorporated herein in their entirety by reference. To the extent the foregoing application and/or any other materials incorporated herein by reference conflict with the disclosure presented herein, the disclosure herein controls.

TECHNICAL FIELD

The present technology relates generally to semiconductor manufacturing equipment, and more particularly, to systems and methods for maintaining a chuck, a wafer, a wafer translator, and an interposer in a releaseably attached state.

BACKGROUND

Semiconductors are used in digital cameras, cell phones, computers, and numerous other technology applications. Semiconductors are typically manufactured in batches individually containing a plurality of semiconductor wafers within and upon which dies having integrated circuits are formed through a variety of semiconductor manufacturing operations. Completed wafers are electrically tested to determine which dies on the wafer are capable of operating according to predetermined specifications. In this way, defective dies are not packaged or otherwise incorporated into finished products.

During electrical testing, conductive regions on the surface of the semiconductor wafer are commonly contacted with a probe card. The wafer is typically mounted on a moveable chuck, which is used to position the wafer relative to a probe card, and to hold the wafer in place during testing. Conventional testing systems utilizing probe cards are expensive and cannot be miniaturized beyond a certain size. Accordingly, it would be desirable to have an improved wafer testing system that can be used to inexpensively, quickly, and effectively test individual dies on semiconductor wafers.

DETAILED DESCRIPTION

Figure 1:
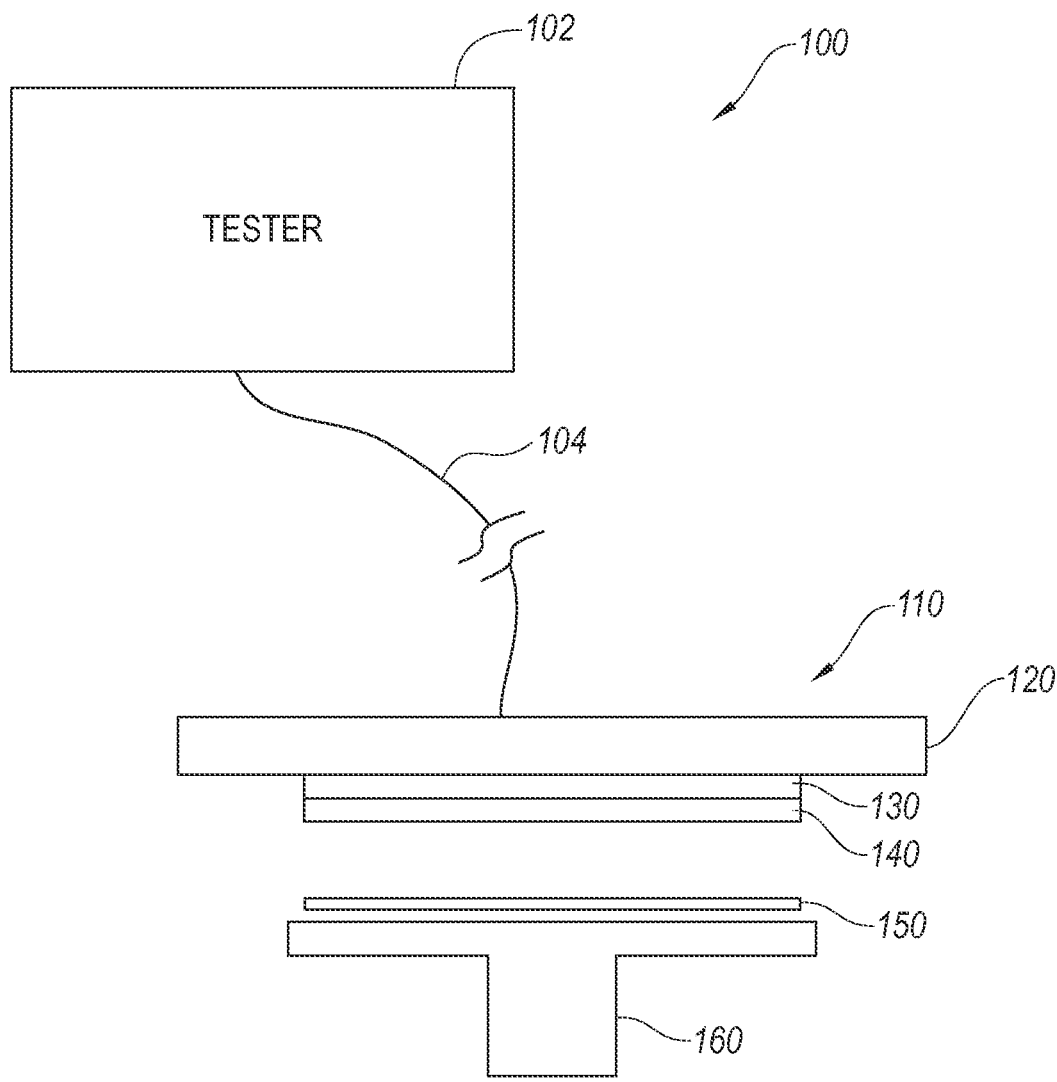
FIG. 1 is a schematic block diagram of a test environment configured in accordance with an embodiment of the presently disclosed technology.

Embodiments of the presently disclosed technology are directed generally to wafer testing systems and associated methods of use and manufacture. Reference herein to "one embodiment", "an embodiment", or similar formulations, means that a particular feature, structure, operation, or characteristic described in connection with the embodiment, is included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

The terms "pad," "contacts," and "electrical terminal," as used herein, generally refer to a conductive region where physical and electrical connection between one component and another is made. In the context of integrated circuits, "pad" typically refers to a metallized region at or near the surface of the integrated circuit, which is commonly used to form a physical connection terminal for communicating signals to and/or from the integrated circuit. Such integrated circuit pads may be formed of a metal, a metal alloy, or a stack structure including several layers of metals and/or metal alloys that are present, typically, at the uppermost layer of conductive material of an integrated circuit.

The expression "wafer translator" refers to an apparatus facilitating the connection of I/O pads (sometimes referred to as terminals, pads, contact pads, bond pads, chip pads, or test pads) of unsingulated integrated circuits, to other electrical components. It will be appreciated that "I/O pads" is a general term, and that the present technology is not limited with regard to whether a particular pad of an integrated circuit is part of an input, output, or input/output circuit.

A wafer translator may be disposed between a wafer and other electrical components. The wafer translator can include a substrate having two major surfaces, each surface having terminals disposed thereon, and electrical pathways disposed through the substrate to provide for electrical continuity between at least one terminal on a first surface and at least one terminal on a second surface. The major surface designed to be disposed toward a wafer can be referred to as the wafer-side of the wafer translator. The wafer-side of the wafer translator can have a pattern of terminals that matches the layout of at least a portion of the I/O pads of the integrated circuits on the wafer. The wafer translator, when disposed between a wafer and other electrical components, makes electrical contact with one or more I/O pads of a plurality of integrated circuits on the wafer, providing an electrical pathway therethrough to the other electrical components.

The wafer translator is a structure that can be used to achieve electrical connections between one or more electrical terminals that have been fabricated at a first scale, or dimension, and a corresponding set of electrical terminals that have been fabricated at a second scale, or dimension. The wafer translator can provide an electrical bridge between the smallest features in one technology (e.g., pins of a probe card) and the largest features in another technology (e.g., bonding pads of an integrated circuit). For convenience, a wafer translator can be referred to simply as translator where there is no ambiguity as to its intended meaning.

The expression "translated wafer" refers to a wafer/wafer translator pair that are in the attached state, and a predetermined portion of, or all of, the contact pads of the integrated circuits on the wafer are in electrical contact with corresponding electrical connections disposed on the wafer-side of the translator. Removable attachment may be achieved, for example, via a vacuum, or other pressure differential attachment. That is, by reducing the pressure in the space between the wafer and the wafer translator relative to the pressure (typically atmospheric pressure) outside that space, the wafer and wafer translator are placed in the attached state.

The term "tester" as used herein refers to equipment, typically electrical equipment, which is used to determine whether an integrated circuit is performing in accordance with a predetermined specification. The terms "chip," "integrated circuit," "semiconductor device," and "microelectronic device" are sometimes used interchangeably in this field. The present technology relates to the manufacture and test of chips, integrated circuits, semiconductor devices and microelectronic devices as these terms are commonly understood in the field.

Described below are several embodiments of wafer testing systems and associated methods of use and manufacture. In one embodiment the wafer testing system includes an assembly for releaseably attaching a wafer to a wafer translator and the wafer translator to an interposer by means of separately operable vacuums, or pressure differentials. The assembly can include a wafer translator support ring coupled to the wafer translator, wherein a first flexible material extends from the wafer translator support ring so as to enclose the space between the wafer translator and the interposer so that the space may be evacuated by a first vacuum through one or more first evacuation paths. The assembly can further include a wafer support ring coupled to the wafer and the chuck, wherein a second flexible material extends from the wafer support ring so as to enclose the space between the wafer and the wafer translator so that the space may be evacuated by a second vacuum through one or more second evacuation pathways.

In another aspect of the present technology, the use of a wafer/wafer translator/interposer in the attached state provides the electrical connection to pads of unsingulated integrated circuits on the wafer in such a manner that the pads are substantially undamaged in the process of making these electrical connections. Various embodiments of the present technology provide a sealing arrangement for facilitating the vacuum attachment of the wafer/wafer translator pair and/or the wafer translator/interposer pair. All or some portion of the air, or any gas or combination of gases, is evacuated from between the wafer and wafer translator through one or more evacuation pathways.

FIG. 1 is a schematic block diagram of a test environment 100 in accordance with an embodiment of the present technology. In the example of FIG. 1, the test environment 100 includes a tester 102 and a prober 110. The tester 102 is electrically coupled to the prober 110 via a cable 104. The prober 110 can include a Device Interface Board ("DIB") 120, an interposer 130, and a wafer translator 140. As will be discussed in further detail below, the wafer translator 140 provides a removable electrical connection to a wafer 150. The wafer 150 includes a plurality semiconductor dies, each die having one or more contacts. The wafer 150 is supported by a probe chuck 160.

During a representative wafer test, the wafer translator 140 and the wafer 150 are positioned such that one or more probes on the wafer translator 140 contact bond pads on the wafer 150. This allows the tester 102 to send stimulus signals to the wafer 150 via a path that includes the cable 104, the DIB 120, the interposer 130, and the wafer translator 140. Similarly, the tester 102 may receive response signals from the wafer 150 over the same path. For example, the tester 102 can obtain diagnostics from individual pads (e.g., the tester 102 can supply a signal to a pad and analyze response at the same pad or a different pad).

Figure 2:
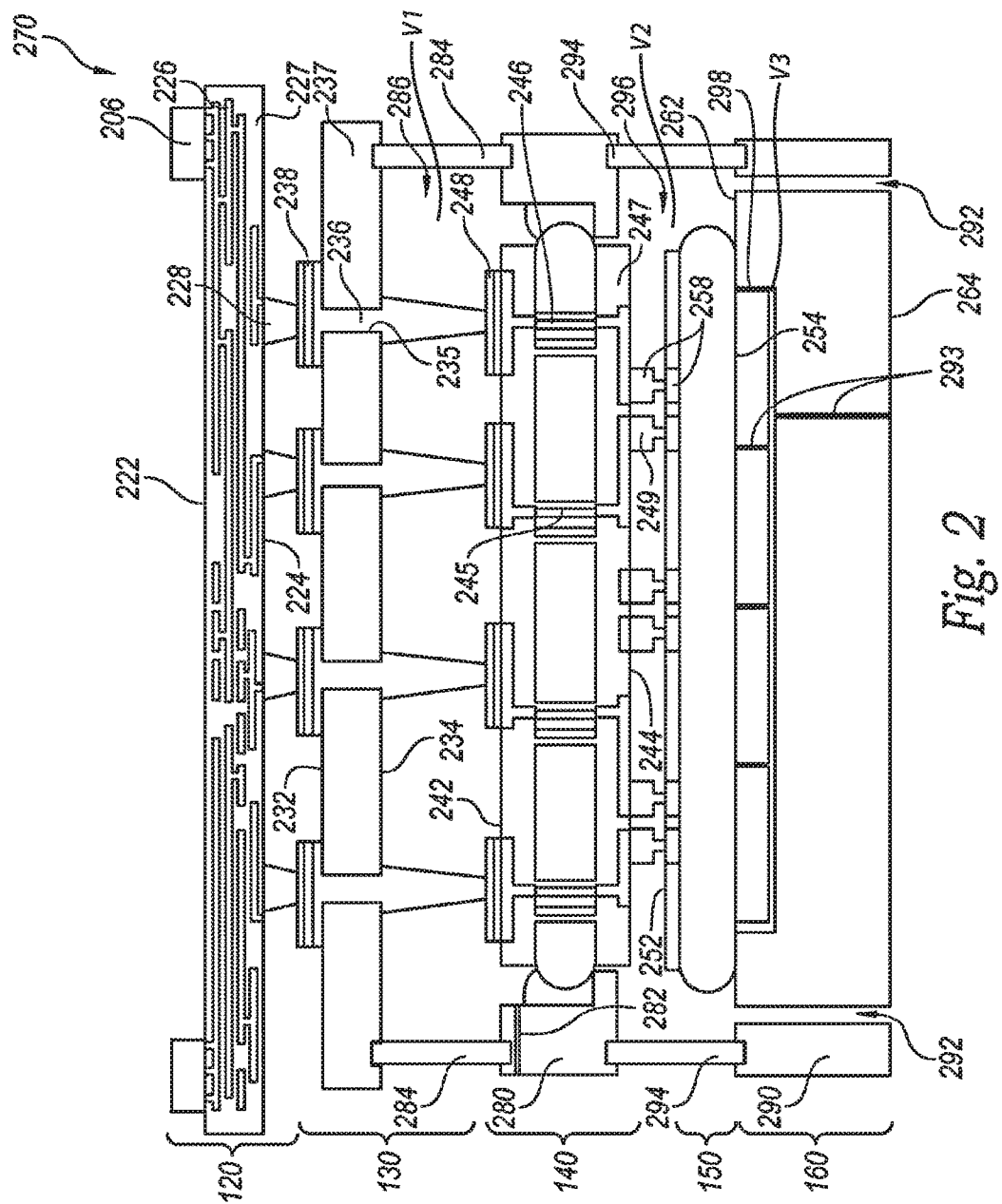
FIG. 2 is a partially schematic illustration of a wafer testing stack configured in accordance with an embodiment of the presently disclosed technology.

FIG. 2 is a partially schematic illustration of a wafer testing stack 270 in accordance with an embodiment of the present technology. The testing stack 270 includes several of the features discussed above with reference to FIG. 1, including the DIB 120, the interposer 130, the wafer translator 140, the wafer 150, and the chuck 160. The testing stack 270 illustrates these features in an attached arrangement, such that a tester (e.g., the tester 102 in FIG. 1) can be operably connected to the wafer 150 via an electrical bridge, link, or path running through the DIB 120, the interposer 130, and the wafer translator 140.

The DIB 120 can be a printed circuit board including a substrate 227 having a first surface 222 and a second surface 224 opposite the first surface 222. One or more cable connectors 206 can be coupled to the first surface 222. The cable connectors 206 can be configured to operably interface with a cable or tester (such as the cable 104 and the tester 102 shown in FIG. 1). One or more DIB contacts 228 can be disposed on the second surface 224 of the DIB 120. The contacts 228 can be operably connected to the cable connectors 206 via electrical pathways 226 running through the substrate 227.

The interposer 130 can be a multi-layer printed circuit board, including an interposer substrate 237 having a first surface 232 facing the second surface 224 of the DIB 120 and a second surface 234 opposite the first surface 232. The interposer 130 can include one or more contact pins 236 positioned in vias 235 in the interposer substrate 237. The vias 235 can traverse the interposer substrate 237 from the first surface 232 to the second surface 234. The contact pins 236 can be operably coupled to contact pads 238 at or near the first surface 232 of the interposer. The contact pads 238 can have a larger surface area than the contact pins 236 and can accordingly improve electrical connection with the DIB contacts 228. The contact pins 236 and contact pads 238 can be made of conductive material, such as nickel/gold. In the illustrated embodiment, the contact pins 236 extend beyond the second surface 234 of the interposer 130 toward the wafer-translator 140. In other embodiments, the contact pins 236 may vary in height relative to the second surface 234 of the interposer 130 and/or relative to other individual contact pins 236.

The wafer translator 140 can include a substrate 247 having a first surface 242 facing the interposer 130. First electrical terminals 248 are located at or near the first surface 242 and are configured to interface with the interposer contact pins 236. Second electrical terminals 249 are located at or near a second surface 244 of the wafer translator 140 opposite the first surface 242 to interface with bond pads 258 on a first surface 252 of the wafer 150. Electrical pathways 246 disposed in vias 245 that traverse the wafer translator substrate 247 provide for electrical continuity between at least one electrical terminal 248 at the first surface 242 and at least one electrical terminal 249 at the second surface 244. The wafer translator 140 accordingly provides an electrical bridge, link or path between the pins 236 on the interposer 130 and bond pads 258 on the wafer 150. The bond pads 258 achieve the final electrical connection between the tester and the internal circuitry of the wafer 150.

The pattern of electrical terminals 249 at the second surface 244 of the wafer translator 140 can match or correspond to the layout of at least a portion of the pads 258 on the wafer 150. The wafer 150 and/or wafer translator 140 can have different patterns or arrangements of pads 258 and electrical terminals 249 in various embodiments of the technology. For example, in certain embodiments, the bond pads 258 and translator electrical terminals 249 are arranged in a polygonal (e.g., hexagonal), or honeycomb-type matrix. An advantage of the hexagonal arrangement is that it facilitates close-packing for the terminals and bond pads. In further embodiments, the bond pads 258 are arranged in a grid. The electrical terminals 249 can be at least partially made of nickel, platinum, nickel-platinum or other electrically-conductive materials and the bond pads 258 can be at least partially made of aluminum or other electrically-conductive material. In certain embodiments, the electrical terminals 249 can be made of a material harder than that of the bond pads 258. The electrical terminals 249 can be deposited or formed on the wafer translator 140 by physical or chemical vapor deposition, screen printing, or other methods.

In some embodiments, the wafer-translator 140 can be generally the same size and/or shape as the wafer 150 and can include a sufficient quantity of electrical terminals 249 to contact and test all of the pads 258 on the wafer 150 with a single touch (e.g., a single instance of contacting the translator 140 with the wafer 150). In certain embodiments, the electrical terminals 249 of the wafer-translator 140 contact 130,000 or more pads 258 on the wafer 150 in a single touch. In a particular embodiment, one million or more pads 258 on the wafer 150 are contacted by a single touch of the wafer translator 140. In certain embodiments, the wafer translator 140 has a different size and/or shape relative to the wafer 150 and tests only a portion of the pads 258 on the wafer 150 at a time. In this latter arrangement, the wafer testing can be performed by tiling the tester across multiple portions of the wafer 150 in succession. For example, in a particular embodiment, two regions of the wafer having 40,000 pads 258 each are contacted in succession by the wafer translator 140.

The structure of the wafer 150 and/or the wafer translator 140 can be tailored to improve contact between these components. For example, the stiffness of the wafer translator 140 can be varied in various embodiments of the technology in order to reduce the need for the pads 258 and electrical terminals 249 to comply with one another. In certain embodiments, a flexible wafer translator 140 offers compliance to the surface of a wafer 150 mounted on a rigid support, while in other embodiments the wafer translator 150 is more rigid. In certain embodiments, the wafer-translator 140 includes one or more stiffener boards or other stiffening features. In particular embodiments, the wafer translator 140 is at least partially made of silicon or ceramic and the wafer is at least partially made of silicon.

Contact between the wafer 150 and the wafer translator 140 can be further improved by reducing bending/cantilevering at the edges of the wafer 150 by adding dummy mechanical contacts or other elevations toward the edges of the wafer 150. Furthermore, the height of pads 258 and/or electrical terminals 249 can be varied either statically or dynamically (e.g., by spring or similar force) across the wafer 150 and/or the wafer translator 140 to improve electrical contact.

In certain embodiments, the wafer translator 140 is removeably or fixedly coupled to a translator support ring 280. The translator support ring 280 can include one or more seals 284 extending therefrom. The seals 284 can be configured to provide an airtight or generally airtight seal between the wafer translator 140 and the interposer 130. The translator support ring 280 can include one or more evacuation pathways, or ports, 282 that traverse the support ring 280. In some embodiments, the evacuation pathways 282 can be fitted with valves to open and close the evacuation pathways 282. As will be discussed in further detail below with reference to FIGS. 3A, 3B, and 5, a first vacuum V1 can be drawn on a space 286 between the interposer 130 and the wafer translator 140 to evacuate air via the evacuation pathways 282, thereby creating a pressure differential that can pull together and releaseably attach the interposer 130 and wafer translator 140. In certain embodiments, the translator support ring 280 has a diameter less than the diameter of the interposer 130 so that the translator support ring evacuation pathway 282 is inside the circumference of the interposer 130. In further embodiments, the translator support ring 290 has a diameter that is the same as or greater than the diameter of the interposer 130, and the evacuation pathways 282 can be in the same or different locations relative to the interposer 130.

The wafer 150 can be positioned in or on a chuck support ring 290 that peripherally surrounds, or at least partially surrounds, the wafer 150 in a manner similar to that described above with reference to the translator support ring 280. The chuck support ring 290 can be integral with the chuck 160 or can comprise a separate component. The chuck support ring 290 can include one or more seals 294 extending therefrom. The seals 294 can be configured to provide an airtight or generally airtight seal between the wafer 150 and the wafer translator 140. The chuck support ring 290 can include one or more evacuation pathways, or ports, 292 that access a space 296 between the wafer translator 140 and the wafer 150. For example, the ports 292 can traverse the chuck 160 from a first surface 262 of the chuck 160 to a second surface 264 of the chuck opposite the first surface 262. In certain embodiments, the evacuation pathways 292 can be fitted with valves to open and close the evacuation pathways 292. As will be discussed in further detail below with reference to FIGS. 4A, 4B, and 5, a second vacuum can operate in the space 296 between the wafer translator 140 and the wafer 150, thereby creating a pressure differential that pulls together and releaseably attaches the wafer translator 140 and the wafer 150. In some embodiments, air or other gas can be evacuated from the air space 296 via the evacuation pathways 292. It will be appreciated that that other suitable configurations for coupling the evacuation pathways 292 to a vacuum source may be used in other embodiments. In certain embodiments, the wafer 150 and the wafer translator 140 can be removeably attached by systems and methods described in U.S. patent application Ser. No. 12/547,418, assigned to the assignee of the present application, filed on Aug. 25, 2009, and entitled "MAINTAINING A WAFER/WAFER TRANSLATOR PAIR IN AN ATTACHED STATE FREE OF A GASKET DISPOSED THEREBETWEEN," which is hereby incorporated by reference in its entirety.

In some embodiments, the wafer 150 can be releaseably coupled to the chuck 160 with a third vacuum. The wafer 150 can be pulled toward and removeably held down on the chuck 160, with a second surface 254 of the wafer 150 contacting the first surface 262 of the chuck 160. The chuck 160 can include vacuum holes 298 to effect the suction between the chuck 160 and the wafer 150. In a particular embodiment, the chuck has a diameter of about 317 mm and the wafer has a diameter of about 300 mm. In other embodiments, the chuck and/or wafer can have other dimensions. In certain embodiments, the chuck support ring 290 has a diameter less than the diameter of the translator support ring 280 so that the translator support ring evacuation pathway 282 is outside the circumference of the chuck support ring 290. In further embodiments, the chuck support ring 290 has the same or a greater diameter than the translator support ring 280. The wafer 150 can be delivered into the chuck 160 by a wafer robot or similarly well-known wafer transport equipment. In some embodiments, the chuck 160 can include a plurality of lift pins to support the second surface 254 of the wafer 150.

Figure 3A:
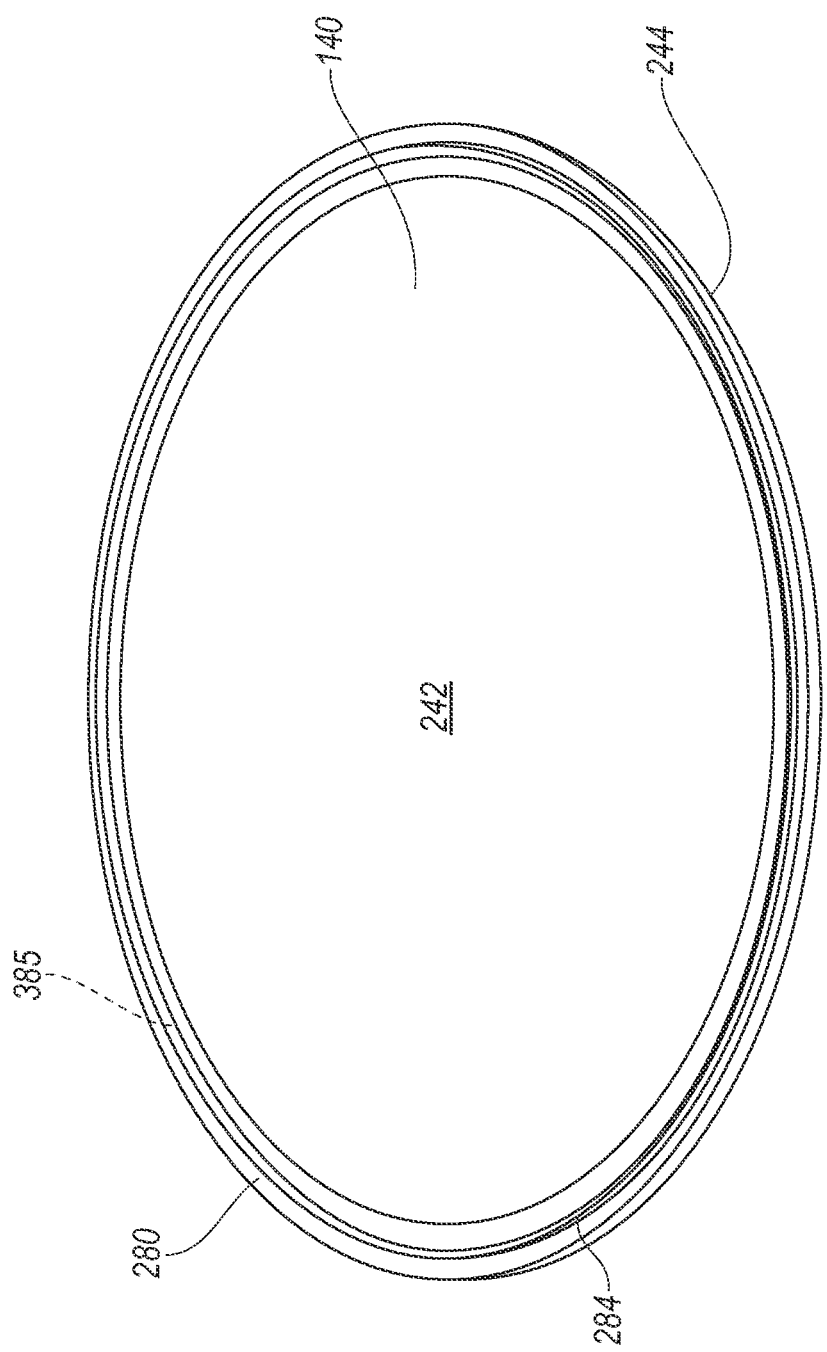
FIG. 3A is a partially schematic isometric view of a wafer translator configured in accordance with an embodiment of the presently disclosed technology.
Figure 3B:
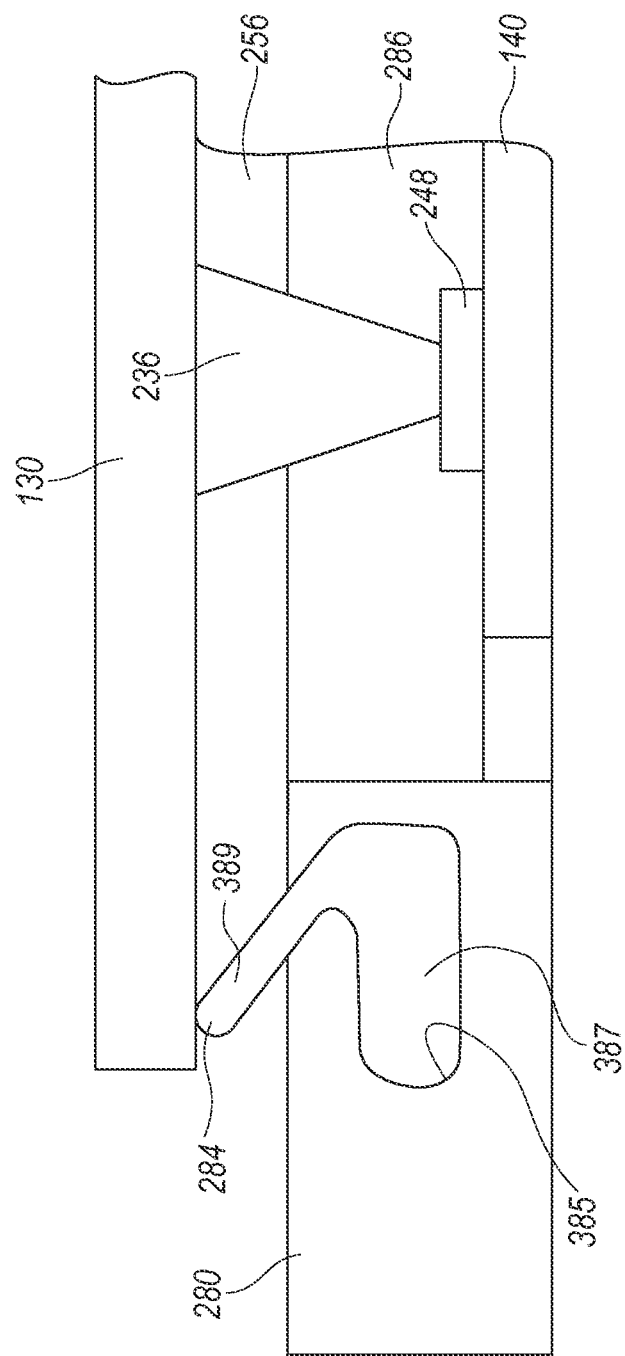
FIG. 3B is a partially schematic cross-sectional side view of a wafer translator operably coupled to an interposer in accordance with an embodiment of the presently disclosed technology.

FIG. 3A is a partially schematic isometric view of a wafer translator configured 140 in accordance with an embodiment of the present technology. FIG. 3B is a partially schematic cross-sectional side view of the wafer translator 140 operably coupled to the interposer 130 in accordance with an embodiment of the present technology. Referring first to FIG. 3A, the wafer translator 140 is coupled to and circumferentially surrounded by the translator support ring 280. In certain embodiments, the support ring 280 is fabricated from a metal, but can include other materials in other embodiments. The support ring 280 includes a groove 385 configured to receive the seal 284. In various embodiments, the seal 284 can be more or less rigid. In the illustrated example, the groove 385 runs continuously around the first surface 242 of the support ring 280. The support ring 280 can include one or more evacuation pathways circumferentially inward of the groove 385. As described above with reference to FIG. 2, the evacuation pathways can traverse through the translator support ring 280 and can be fitted with valves to open and close the evacuation pathways.

Referring now to FIG. 3B, the seal 284 includes a base portion 387 seated in the groove 385 and an upper portion 389 extending outwardly from the support ring 280. The groove 385 can be flanged so as to retain the base portion 387 of the seal 284. In the illustrated embodiment, the upper portion 389 is angled circumferentially outward with respect to the top side of the support ring 280, but in other embodiments the upper portion 389 can be vertical or approximately vertical relative to the top side of the support ring 280. The upper portion 389 is configured to act as a seal to maintain a vacuum or partial vacuum in the space 286 between the wafer translator 140 and the interposer 130. The vacuum holds the wafer translator 140 and interposer 130 in a removeably attached state. The wafer translator 140 and the interposer 130 can be released from one another by releasing the seal 284 or by opening a valve to open the evacuation pathways.

Figure 4A:
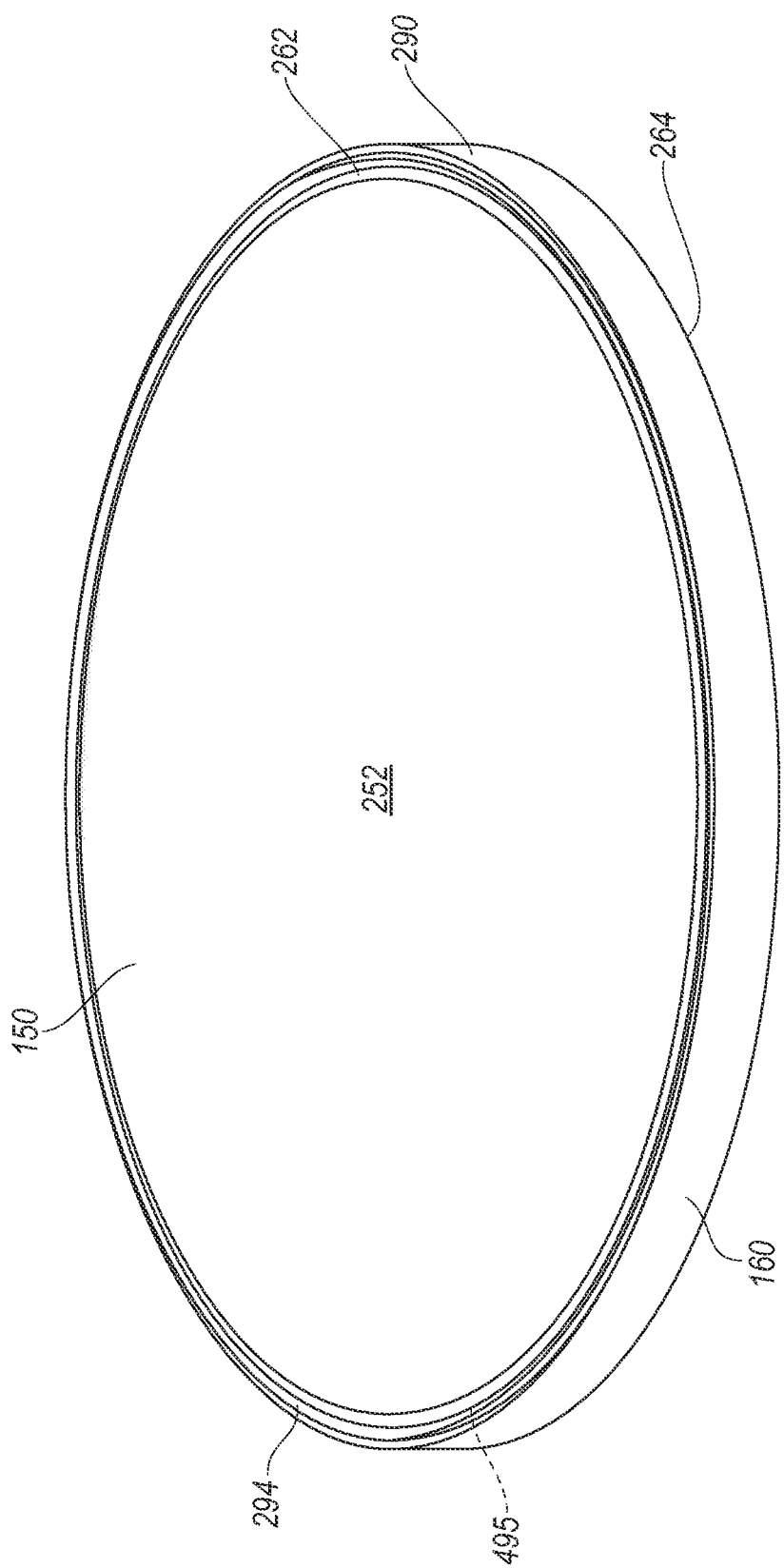
FIG. 4A is a partially schematic isometric view of a wafer coupled to a wafer chuck in accordance with an embodiment of the presently disclosed technology.
Figure 4B:
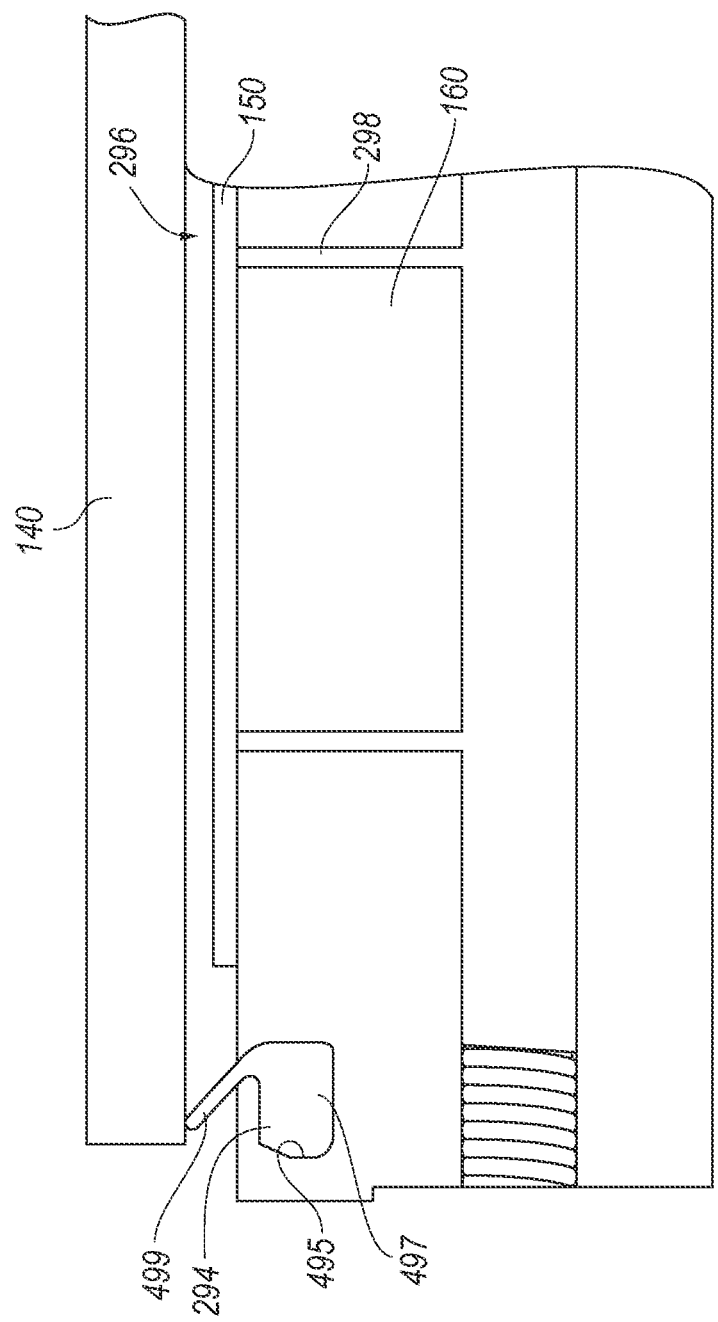
FIG. 4B is a partially schematic cross-sectional side view of a wafer and wafer chuck operably coupled to the wafer translator in accordance with an embodiment of the presently disclosed technology.

FIG. 4A is a partially schematic isometric view of the wafer 150 positioned on the wafer chuck 160 in accordance with an embodiment of the present technology. FIG. 4B is a partially schematic cross-sectional side view of the wafer 150 and wafer chuck 160 operably coupled to the wafer translator 140 in accordance with an embodiment of the present technology. Referring first to FIG. 4A, the wafer 150 is coupled to and circumferentially surrounded by the chuck support ring 290. The chuck support ring 290 includes a groove 495 configured to receive the seal 294. In the illustrated embodiment, the groove 495 runs continuously around the topside of the support ring 290. The chuck support ring 290 can include one or more evacuation pathways (not visible in FIG. 4A) circumferentially inward of the groove 495. The evacuation pathways can traverse from the first surface 262 of the chuck to the second surface 264. The evacuation pathways in the ring 290 may be fitted with valves to open and close the evacuation pathways. In some embodiments, the chuck support ring 290 is integral to the chuck 160, and the chuck 160 is releaseably coupled to the wafer 150 (e.g., the chuck 160 can act as a vacuum holddown device for the wafer 150 via the chuck vacuum holes 298 using vacuum V3).

Referring now to FIG. 4B, the seal 294 includes a base portion 497 seated in the groove 495 and an upper portion 499 extending outwardly from the support ring 290. The groove 495 can be flanged so as to retain the base portion 497 of the seal 294. In the illustrated embodiment, the upper portion 499 is angled with respect to the top side of the support ring 290, but in other embodiments the upper portion 499 can be vertical or approximately vertical. The upper portion 499 is configured to act as a seal to maintain a vacuum or partial vacuum V2 in the space 296 between the wafer translator 140 and the wafer 150. The vacuum holds the wafer translator 140 and wafer 150 in a removeably attached state. The wafer translator 140 and wafer 150 can be released from one another by releasing the seal 294 or by opening a valve to open one or more evacuation pathways.

Figure 5:
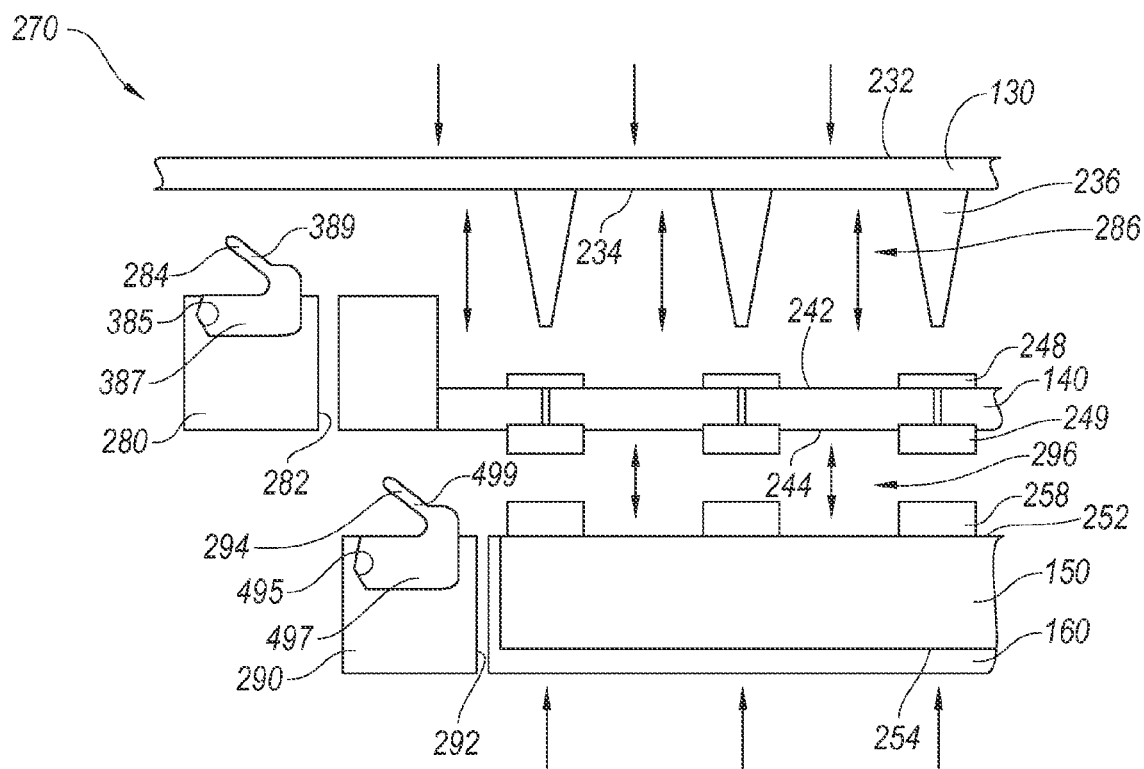
FIG. 5 is a partially schematic side view of a portion of the wafer testing stack of FIG. 2 during an attachment process in accordance with an embodiment of the presently disclosed technology.

FIG. 5 is a partially schematic side view of a portion of the wafer testing stack 270 of FIG. 2 during an attachment process in accordance with an embodiment of the present technology. As described above with reference to FIGS. 2-4B, a plurality of vacuums can independently operate to (a) removeably attach the interposer 130 to the wafer translator 140, (b) removeably attach the wafer translator 140 to the wafer 150, and/or (c) removeably attach the wafer 150 to the chuck 160. In the illustrated embodiment, the chuck 160 and wafer 150 are removeably attached and together move upward toward the wafer translator 140 while the interposer 130 moves downward toward the wafer translator 140. In certain embodiments, only one of the interposer 130 and the chuck 160 moves toward the other while one of these elements remains stationary. Typically, the wafer translator 140 and wafer 150 are aligned with respect to each other such that electrical terminals 249 disposed at the second surface 244 of the wafer translator 140 and pads 258 at the first surface 252 of the wafer 150 make electrical contact with each other when the space 296 between the wafer 150 and wafer translator 140 is evacuated. The interposer 130 and wafer translator 140 are likewise aligned with respect to each other such that the electrical terminals 248 disposed on the first surface 242 of the wafer translator 140 and the interposer contact pins 236 make electrical contact with each other when the space 286 between the wafer translator 130 and the interposer 130 is evacuated.

As the wafer 150 approaches the wafer translator 140, the chuck seal 294 contacts the second surface 244 of the wafer translator 140 or the wafer translator support ring 280 and seals the space 296 between the wafer 150 and the wafer translator 140. As the air or other gas is drawn out through the chuck support ring evacuation pathways 292 via a vacuum, the air pressure of the atmosphere presses wafer translator 140 and wafer 150 into a removeably attached state wherein the electrical terminals 249 on the second surface 244 of the wafer translator 140 make electrical contact with the pads 258 of the first side 252 of the wafer 150. Likewise, as the interposer 130 approaches the wafer translator 140, the wafer translator seal 284 contacts a peripheral annular portion of the second surface 234 of the interposer 130 and seals the space 286 between the interposer 130 and the wafer translator 140. Air or other gas between the wafer translator 140 and the interposer 130 is drawn out from the space 286 through evacuation pathways 282. The air pressure outside the wafer translator 140 and the interposer 130 can press these components into a removeably attached state wherein the electrical terminals 248 on the first side 242 of the wafer translator 140 make electrical contact with the contact pins 236 on the second side 234 of the interposer 130. While the illustrated embodiment shows the interposer 130, wafer translator 140, and wafer 150/chuck 160 simultaneously attaching to form a wafer testing stack, in certain embodiments the components may attach to one another sequentially (e.g., the interposer 130 and wafer translator 140 may attach to one another before the wafer translator 140 is attached to the wafer 150).

Figure 6:
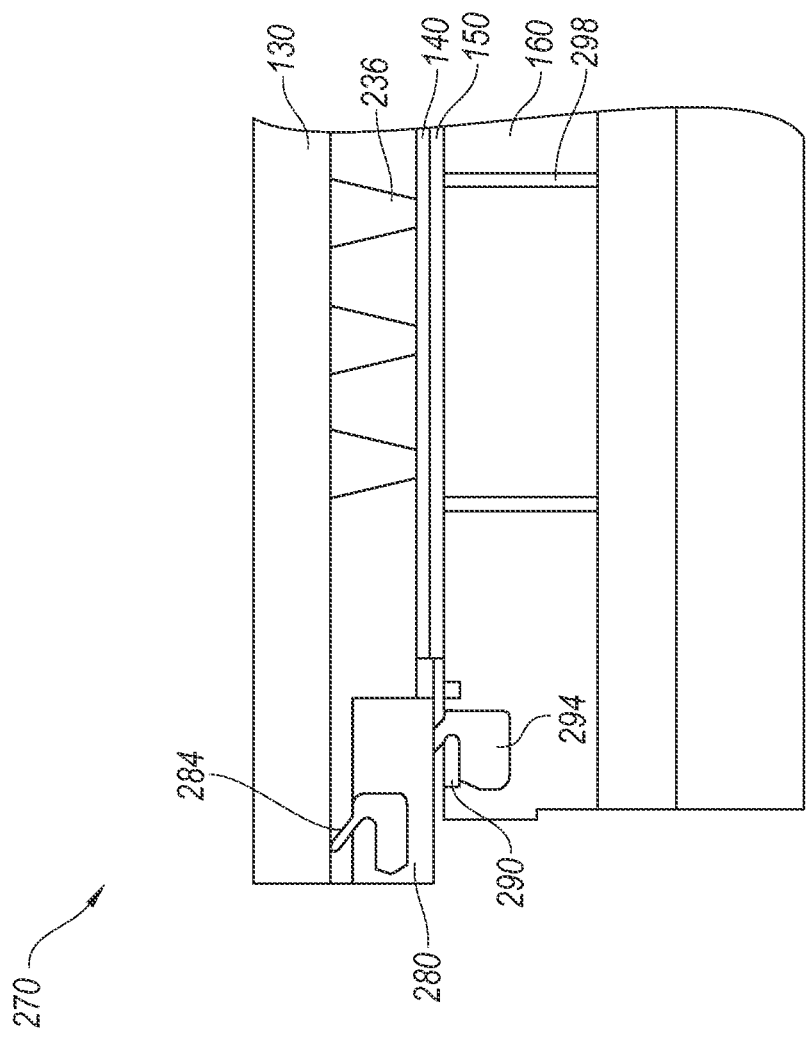
FIG. 6 is a partially schematic side view of the portion of the wafer testing stack of FIG. 5 after the wafer chuck, wafer, wafer translator, and interposer have been releaseably attached in a stacked configuration.

FIG. 6 is a partially schematic side view of the portion of the wafer testing stack 270 of FIG. 5 after the chuck 160, wafer 150, wafer translator 140, and interposer 130 have been releaseably attached in a stacked configuration. The seal 284 extending from the wafer translator support ring 280 engages the interposer 130 to create an airtight or generally airtight seal between the interposer 130 and the wafer translator 140 after these components have been pulled together via a first vacuum. The seal 294 extending from the chuck support ring 290 likewise creates a second airtight or generally airtight seal between the wafer 150 and the wafer translator 140 after these components have been pulled together via a second vacuum. The chuck 160 and wafer 150 have been releaseably attached via a third vacuum operating through chuck vacuum holes 298.

The first, second, and third vacuums can be independently operable, providing different pressure forces between the chuck 160 and wafer 150, between the wafer 150 and wafer translator 140, and between the wafer translator 140 and the interposer 130. The pressure forces between these components can accordingly be independently altered to improve contact and testing performance without excessive pressure force that can damage the contacts or other components of the devices. In further embodiments, the air space between two or more of the components can be in fluid communication with one another, and can be sealed by a common vacuum.

Embodiments of the present technology can provide many advantages in the wafer testing technologies. For example, the wafer testing systems disclosed herein can be easily adaptable when it is necessary to change out types of wafers for testing. More specifically, when a new type of wafer, having an alternate arrangement of pads, is ready to be tested, only the wafer translator (or only the wafer-side of the wafer-translator) needs to be replaced to match the bond pad arrangement of the new wafer. The DIB and interposer can universally accommodate multiple types of wafers. This arrangement can lead to substantial cost savings over traditional systems in which the entire prober are replaced when a wafer having a new configuration was used.

The ability to accommodate different types of wafers is additionally supported by the separately-controllable vacuums. More specifically, the vacuums can control the pressure forces between components to provide for effective electrical contact, and can adjust the pressure differential between the wafer and the wafer translator to suit the specific arrangement and number of bond pads on the new wafer. The multi-vacuum system also enables the wafer-translator to fine-tune contact forces and more effectively contact the entire wafer, thereby testing all of the pads on the wafer with a single touch. This can reduce testing time and can reduce wear on individual pads from repeated or overly-forceful testing.

Furthermore, the systems disclosed herein provide for a wafer translator having contacts that are smaller than those in typical testing systems. The smaller contacts on the translator can increase the testing rate of the wafer because there is less of an antenna effect between smaller contacts. In certain embodiments, the testing rate can be about 500 Mbits per second. In further embodiments the testing rate can be about 120 Gbits per second.

From the foregoing, it will be appreciated that specific embodiments of the technology have been described herein for purposes of illustration, but that various modifications may be made without deviating from the scope of the technology. For example, the wafers and translators can have contacts arranged in configurations other than those expressly shown and described above. Certain aspects of the disclosure described in the context of particular embodiments may be combined or eliminated in other embodiments. For example, some embodiments include only particular elements of the wafer stack. Accordingly, the present disclosure and associated technology can encompass other embodiments not expressly shown or described herein.

We claim:

1. A method for establishing contact with a wafer having a bond pad, comprising:
    placing an interposer to face a first side of a wafer translator,
    placing the wafer translator to face toward the wafer with a second side that is opposite from the first side, the wafer translator having a first terminal facing the interposer and a second terminal facing the bond pad of the wafer, wherein the first terminal is larger than the second terminal;
    sealing a first space between the interposer and the wafer translator using a first seal;
    drawing a first vacuum on the first space; and
    contacting the bond pad of the wafer with the second terminal of the wafer translator.

2. The method of claim 1, further comprising:
    sealing a second space between the wafer and the wafer translator using a second seal;
    establishing a second vacuum in the second space; and
    contacting the bond pad of the wafer with the terminal of the wafer translator under the first and second vacuums.

3. The method of claim 2, further comprising adjusting at least one of the first and second vacuums based on a target contact force between the terminal and the bond pad.

4. The method of claim 2, further comprising adjusting at least one of the first and second vacuums such that the terminal and the bond pad are in electrical and mechanical contact.

5. The method of claim 2, further comprising:
placing the wafer on a chuck, the wafer having a first side facing the wafer translator and a second side facing the chuck;
establishing a third vacuum between the second side of the wafer and the chuck; and
adjusting at least one of the first, second, and third vacuums based on a target contact force between the terminal and the bond pad.

6. The method of claim 2 wherein:
the bond pad is a first bond pad;
the wafer further includes a plurality of additional bond pads;
the wafer translator further includes a plurality of additional terminals corresponding to the bond pads of the wafer; and
the method further includes adjusting at least one of the first and second vacuums based on a target contact force between the plurality of terminals and the corresponding bond pads.

7. The method of claim 2, further comprising controlling forces on the wafer translator by adjusting the first vacuum in the first space and the second vacuum in the second space to be different.

8. A method for establishing contact with a wafer having a bond pad, comprising:
placing a wafer translator to face toward the wafer, the wafer translator having a first terminal on a first side facing away from the wafer and a second terminal on a second side facing the bond pad of the wafer, wherein the first terminal is larger than the second terminal;
sealing a second space between the wafer translator and the wafer using a second seal; and
drawing a second vacuum on the second space to contact the bond pad of the wafer with the second terminal of the wafer translator.

9. The method of claim 8, further comprising:
placing an interposer to face the wafer translator; and
sealing a first space between the interposer and the wafer translator using a first seal.

* * * * *